US011320738B2

(12) United States Patent
Wang et al.

(10) Patent No.: US 11,320,738 B2
(45) Date of Patent: May 3, 2022

(54) PATTERN FORMATION METHOD AND MATERIAL FOR MANUFACTURING SEMICONDUCTOR DEVICES

(71) Applicant: TAIWAN SEMICONDUCTOR MANUFACTURING CO., LTD., Hsinchu (TW)

(72) Inventors: Chien-Wei Wang, Zhubei (TW); Ching-Yu Chang, Yilang County (TW); Shang-Wern Chang, Zhubei (TW); Yen-Hao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 271 days.

(21) Appl. No.: 16/366,290

(22) Filed: Mar. 27, 2019

(65) Prior Publication Data
US 2020/0004151 A1    Jan. 2, 2020

Related U.S. Application Data

(60) Provisional application No. 62/690,846, filed on Jun. 27, 2018.

(51) Int. Cl.
| | | |
|---|---|---|
| G03F 7/38 | (2006.01) | |
| G03F 7/11 | (2006.01) | |
| G03F 7/095 | (2006.01) | |

(52) U.S. Cl.
CPC .......... *G03F 7/38* (2013.01); *G03F 7/095* (2013.01); *G03F 7/11* (2013.01)

(58) Field of Classification Search
None
See application file for complete search history.

(56) References Cited

U.S. PATENT DOCUMENTS

| | | |
|---|---|---|
| 6,025,117 A | 2/2000 | Nakano et al. |
| 8,551,808 B2 | 10/2013 | Marsh et al. |
| | (Continued) | |

FOREIGN PATENT DOCUMENTS

| | | |
|---|---|---|
| CN | 101136333 A | 3/2008 |
| CN | 103748517 A | 4/2014 |
| | (Continued) | |

OTHER PUBLICATIONS

Mari Miyano et al., "Photophysical properties of luminescent silicon nanoparticles surface-modified with organic molecules via hydrosilyation," Photochemical & Photobiological Sciences, vol. 15, 99-104 (2016).

(Continued)

*Primary Examiner* — Kathleen Duda
(74) *Attorney, Agent, or Firm* — McDermott Will & Emery LLP

(57) ABSTRACT

In a pattern formation method, a bottom layer is formed over an underlying layer. A middle layer is formed over the bottom layer. A resist pattern is formed over the middle layer. The middle layer is patterned by using the resist pattern as an etching mask. The bottom layer is patterned by using the patterned middle layer. The underlying layer is patterned. The middle layer contains silicon in an amount of 50 wt % or more and an organic material. In one or more of the foregoing and following embodiments, an annealing operation is further performed after the middle layer is formed.

20 Claims, 11 Drawing Sheets

(56) References Cited

U.S. PATENT DOCUMENTS

| | | |
|---|---|---|
| 2006/0019195 A1 | 1/2006 | Hatakeyama et al. |
| 2007/0117044 A1 | 5/2007 | Ogihara et al. |
| 2009/0004604 A1 | 1/2009 | Lee et al. |
| 2010/0025768 A1* | 2/2010 | Sakakura .......... H01L 21/76879 |
| | | 257/368 |
| 2011/0171789 A1 | 7/2011 | Korgel et al. |
| 2012/0223418 A1 | 9/2012 | Stowers et al. |
| 2016/0284557 A1 | 9/2016 | Chen et al. |
| 2018/0097233 A1* | 4/2018 | Huang .................. H01M 4/525 |
| 2018/0173096 A1 | 6/2018 | Zi et al. |

FOREIGN PATENT DOCUMENTS

| | | |
|---|---|---|
| DE | 10 2010 037 278 A1 | 3/2012 |
| EP | 2364840 A1 | 9/2011 |
| JP | 2009024158 A | 2/2009 |
| TW | 200401169 A | 1/2004 |
| TW | 201204790 A | 2/2012 |
| WO | 99/21934 A1 | 5/1999 |

OTHER PUBLICATIONS

Milena Rosso-Vasic et al., Alkyl-Functionalized Oxide-Free Silicon Nanoparticles: Synthesis and Optical Properties, Small, vol. 4, No. 10, 1835-1841 (2008).

Milena Rosso-Vasic et al., "Amine-terminated silicon nanoparticles: synthesis, optical properties and their use in bioimaging," Journal of Materials Chemistry, vol. 19, pp. 5926-5933 (2009).

F. Huisken et al., Light-Emitting Silicon Nanocrystals from Laser Pyrolysis, Advanced Materials, vol. 14, No. 24, pp. 1861-1865 (Dec. 2002).

* cited by examiner

PATTERN FORMATION METHOD AND MATERIAL FOR MANUFACTURING SEMICONDUCTOR DEVICES

RELATED APPLICATION

This application claims priority to U.S. Provisional Patent Application No. 62/690,846 filed on Jun. 27, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues become greater. Lithography operations to form patterns are one of the key operations in the semiconductor manufacturing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
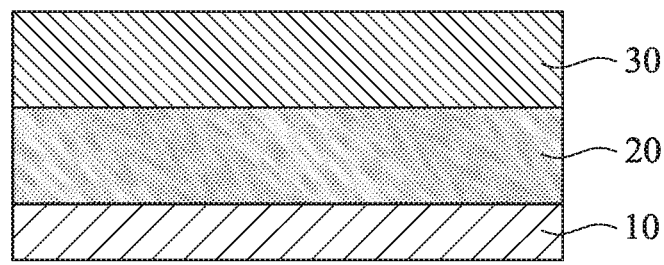
FIG. 1 shows one of the various stages of manufacturing operations of semiconductor devices according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. The semiconductor devices include a fin field effect transistor (FinFET) and other MOS transistors. Other types of transistors, such as a gate-all-around (GAA) FET, also benefit from the present embodiments. Semiconductor devices may further include a static random access memory (SRAM) and/or other logic circuits, passive components such as resistors, capacitors, and inductors, and active components. The semiconductor device may include a plurality of semiconductor devices (e.g., transistors), which may be interconnected. It is understood, however, that the application should not be limited to a particular type of device, except as specifically claimed.

When a FinFET, which includes a three dimensional fin structure, is utilized, unevenness is caused on an interlayer dielectric (ILD) layer, which affects performance of lithography operations. To address these issues, a multi-layer resist patterning system has been developed.

In the multi-layer resist patterning system, for example, a tri-layer resist patterning system employs a bottom layer, a middle layer and a photo resist layer. In the tri-layer resist patterning system, the middle layer is etched by using the photo resist pattern as an etching mask, and the bottom layer is etched by using the patterned middle layer as an etching mask. Finally, the underlying layer to be patterned is etched by using the patterned middle and/or bottom layer. In these etching operations, however, pattern width (critical dimensions "CD") varies from the intended or designed value. As the critical dimension of the patterns continues to shrink, this CD variation becomes more critical.

In the present disclosure, in a tri-layer or a bi-layer resist system, a layer on which a photo resist pattern is formed includes Si in an amount of 50 wt % or more, to suppress the CD variation during the etching operations of the tri-layer or bi-layer resist system.

FIGS. 1-6 show various stages of manufacturing a semiconductor device according to an embodiment of the present disclosure. It is understood that additional operations can be performed before, during, and after processes shown by FIGS. 1-6, and some of the operations described below can be replaced or eliminated for additional embodiments of the method. The order of the operations/processes may be interchangeable.

As shown in FIG. 1, an underlying layer 20 to be patterned is formed over a substrate 10. One or more layers or structures are provided between the underlying layer 20 and the substrate 10 in some embodiments. In one embodiment, the substrate 10 is a silicon substrate. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate. The substrate may include various regions that have been suitably doped with impurities (e.g., p-type or n-type conductivity).

The underlying layer 20 includes one or more layers of dielectric material or conductive material. The dielectric material includes silicon oxide, silicon nitride, silicon oxynitride (SiON), SiOCN, SiCO, SiCN, fluorine-doped silicate glass (FSG), or a low-k dielectric material, or any other suitable dielectric material. The dielectric material layer may be formed by chemical vapor deposition (CVD), physical vapor deposition (PVD), atomic layer deposition (ALD), or other suitable film forming processes. In some embodiments, after the dielectric layer is formed, a planarization process, such as an etch back process and/or a chemical mechanical polishing (CMP) process is performed on the dielectric layer.

The conductive material includes a semiconductor material, such as an elementary semiconductor including silicon or germanium; Group IV-IV compound semiconductors; or Group III-V compound semiconductors as set forth above. The semiconductor material can be poly crystalline, amorphous or crystalline. The conductive material also includes metallic material, such as Al, Cu, AlCu, W, Co, Ti, Ta, Ni, silicide, TiN or TaN, or any suitable material. The conductive material can be formed by CVD, PVD, ALD, molecular beam epitaxy (MBE), electro plating, or other suitable film forming processes.

Further, as shown in FIG. 1, a bottom layer 30 is formed over the underlying layer 20. In some embodiments, the bottom layer 30 is made of an organic material. The organic material may include a plurality of monomers or polymers that are not cross-linked. Generally, the bottom layer 30 may contain a material that is patternable and/or have a composition tuned to provide anti-reflection properties. Exemplary materials for the bottom layer 30 include carbon backbone polymers, such as polyhydroxystyrene (PHS), poly methyl methacrylate (PMMA), polyether, and combinations thereof, and other organic polymers containing aromatic rings. The bottom layer 30 is used to planarize the structure, as the underlying structure may be uneven. In some embodiments, the bottom layer 30 is formed by a spin coating process. In other embodiments, the bottom layer 30 is formed by another suitable deposition process. The thickness of the bottom layer 30 is in a range from about 50 nm to about 200 nm in some embodiments and is in a range from about 80 nm to about 120 nm in other embodiments. In some embodiments, after the bottom layer 30 is formed, an annealing operation is performed.

Figure 2:
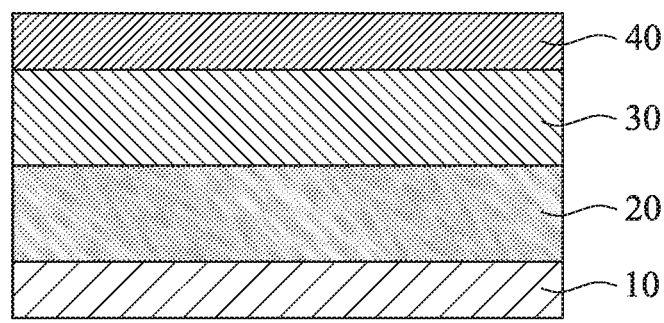
FIG. 2 shows one of the various stages of manufacturing operations of semiconductor devices according to an embodiment of the present disclosure.

Then, as shown in FIG. 2, a middle layer 40 is formed over the bottom layer 30. In some embodiments, the middle layer 40 is formed by spin-coating a silicon containing solution over the bottom layer, and the coated layer is baked at 80-120° C. for 30 sec to 120 sec. In some embodiments, the baking of the coated layer is performed on a baking plate. The thickness of the middle layer 40 is in a range from about 20 nm to about 100 nm in some embodiments, and is in a range from about 30 nm to about 80 nm in other embodiments.

The middle layer 40 is a silicon containing layer including silicon and organic material. In the present disclosure, the middle layer 40 after the plate-baking contains silicon in an amount of 50 wt % or more. In some embodiments, the middle layer 40 contains silicon in an amount of 60 wt % or more. In some embodiments, the Si amount of the middle layer 40 is up to 70 wt % and in up to 80 wt % in other embodiments.

Figure 7:
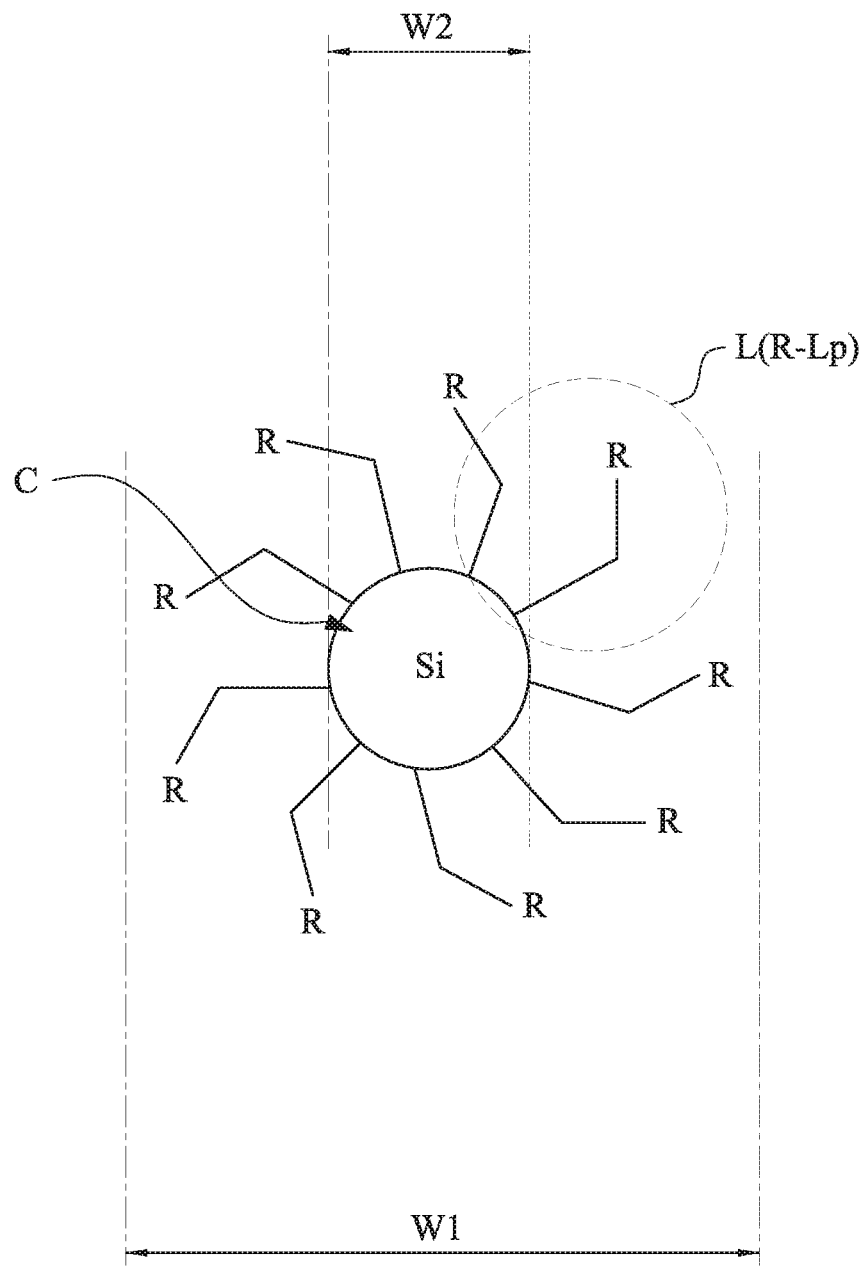
FIG. 7 shows a schematic view of a silicon particle or cluster.

As set forth above, the silicon containing middle layer is formed from a silicon containing solution. The silicon containing solution includes silicon particles and solvent. In some embodiments, each of the silicon particles includes a silicon core C surrounded by a plurality of ligands L as shown in FIG. 7. In some embodiments, a size W1 of the silicon particle is in a range from 1 nm to 20 nm, and is in a range from about 2 nm to about 15 nm in other embodiments. The silicon core C is a solid crystalline or noncrystalline silicon, a cluster (secondary particle) of silicon primary particles, a silicon ring, or a porous silicon. In some embodiments, a diameter W2 of the silicon core C is in a range from about 1 nm to about 20 nm, and is in a range from about 2 nm to about 15 nm in other embodiments. In some embodiments, the core C is made of one of Ti, Sn, Al, T and Au and has a diameter W2 in a range from about 1 nm to about 20 nm. The diameter is in a range from about 2 nm to about 15 nm in other embodiments.

In some embodiments, each of the plurality of ligands L is an organic ligand. The organic ligand is one or more of styrene, 1-decene, 1-vynylnaphtharene, alkyl group (e.g., methyl, ethyl, propyl, butyl, pentyl, hexyl, heptyl, octyl, nonyl, decyl, . . . ; the number of carbon is up to 20), alkynyl group (e.g., the number of carbon is up to 20), alkenyl groups (e.g., the number of carbon is up to 20). The ligand L has a chemical structure R-Lp, where R represents a first spacer group, and Lp represents a polar group linked to the silicon core C. The first spacer group R may include hydrogen, aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12. The first spacer group R links with polar groups Lp. The polar group Lp may include —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

The silicon particles are mixed with a solvent to form the silicon containing solution. The solvents include, for example: glycol ethers such as 2-methoxyethyl ether(diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; cellosolve esters such as methyl cellosolve acetate; aromatic hydrocarbons such as toluene and xylene; and ketones such as acetone, methylethyl ketone, cyclohexanone and 2-heptanone. Two or more kinds of solvents can be used. The viscosity of the silicon containing solution is in a range from about 0.2 centipoise to about 3000 centipoise in some embodiments. The silicon containing solution can be spin-coated over the bottom layer by using a photo-resist coating apparatus, or other suitable coating apparatus. The silicon containing solution may further contain stabilizer. The stabilizer adjusts pH to suitable value to stabilize the silicon containing solution. The pH value ranges from 2 to 12. The stabilizer includes organic acid or base.

In some embodiments, the silicon particle or the silicon cluster include silicon in an amount of 50 wt % or more. In other embodiments, the silicon particle or the silicon cluster contains silicon in an amount of 60 wt % or more. In some embodiments, the Si amount of the silicon particle or the silicon cluster is up to 70 wt % and in up to 80 wt % in other embodiments. If any additional solid additive is mixed with the silicon containing solution, the silicon amount is calculated based on the total weight of solid elements of the silicon solution other than the solvent.

In some embodiments, the middle layer 40 further includes an organic polymer. The organic polymer includes a silicon containing polymer. The silicon containing polymer includes an organic polymer and a cross-linker. In certain embodiments, the silicon containing polymer further includes a chromophore (dye), a photo acid generator, a base quencher and/or fluorocarbon. The organic polymer backbone can be polyhydroxystyrene (PHS), poly methyl methacrylate (PMMA), polyether, and combinations thereof, and other organic polymers containing aromatic rings.

In some embodiments, after the middle layer 40 is formed, a thermal operation, such as an annealing operation is performed. The annealing operation is performed in addition to or instead of the baking operation as set forth above. The annealing operation makes the surface of the coated middle layer 40 smooth or flat. After the annealing, the surface roughness Ra of the middle layer 40 is more than 0 nm and less than 5 nm in some embodiments.

In some embodiments, a temperature of the annealing operation is in a range from about 250° C. to about 1000° C. as a substrate temperature, and is in a range from about 300° C. to about 500° C. in other embodiments. In some embodiments, the annealing operation is thermal baking on a baking plate. In such a case, a process time of the thermal baking is in a range from about 30 sec to about 600 sec in some embodiments, and is in a range from about 60 sec to about 300 sec in other embodiments.

In other embodiments, the annealing operation utilizes electromagnetic waves having a wavelength in a range from about 120 nm to about 12,000 nm. In certain embodiments, the annealing operation is lamp annealing. In such a case, a process time of the lamp annealing is in a range from about 1 sec to about 180 sec in some embodiments, and is in a range from about 10 sec to about 60 sec in other embodiments. In other embodiments, the annealing operation is laser annealing. In such a case, a process time of the laser annealing is in a range from about 0.1 msec to about 10 sec in some embodiments, and is in a range from about 10 msec to about 1 sec in other embodiments.

In some embodiments, the annealing operation includes 2 steps including a first step at a first temperature and a second step at a second temperature higher than the first temperature. The first temperature is in a range from about 80° C. to about 200° C. and the second temperature is in a range from about 250° C. to about 1000° C. in some embodiments.

After the annealing operation, the thickness of the middle layer 40 is in a range from about 15 nm to about 90 nm in some embodiments, and is in a range from about 20 nm to about 70 nm on other embodiments.

Figure 3:
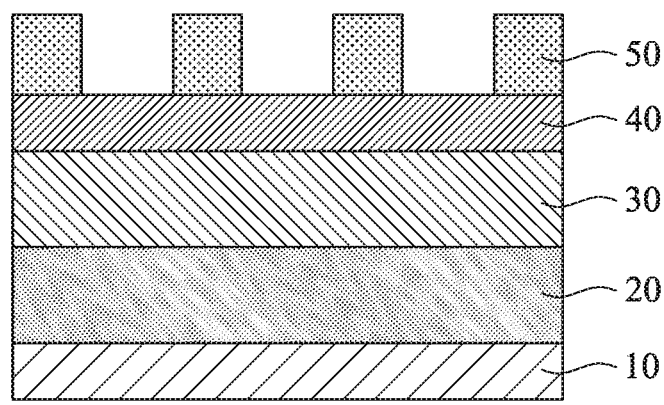
FIG. 3 shows one of the various stages of manufacturing operations of semiconductor devices according to an embodiment of the present disclosure.

Further, as shown in FIG. 3, a photo resist pattern 50 is formed over the middle layer. A photo resist layer is spin-coated on the middle layer, and the photo resist layer is exposed with an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied. After development of the exposed photo resist, the resist pattern 50 is obtained.

In some embodiments, an adhesion layer is disposed between the middle layer 40 and the photo resist layer 50.

Figure 4:
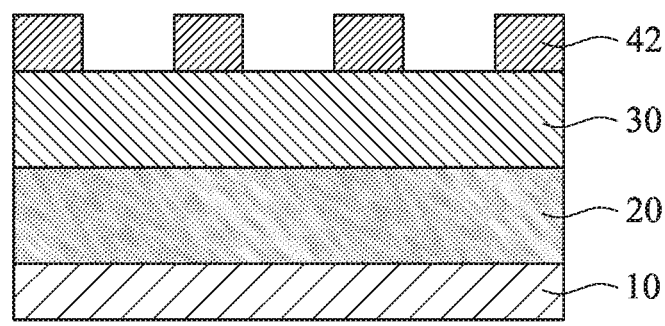
FIG. 4 shows one of the various stages of manufacturing operations of semiconductor devices according to an embodiment of the present disclosure.

Then, as shown in FIG. 4, the middle layer 40 is patterned to form a patterned middle layer 42 by using the photo resist pattern 50 as an etching mask. Since the middle layer 40 is mainly made of silicon, one or more dry etching operations using $Cl_2$, HBr, $SF_6$ and/or other suitable etching gas are employed to pattern the middle layer 40. A CD variation between the photo resist pattern 50 and the patterned middle layer 42 is within ±2 nm in some embodiments, and is within ±1.5 nm in other embodiments.

Figure 5:
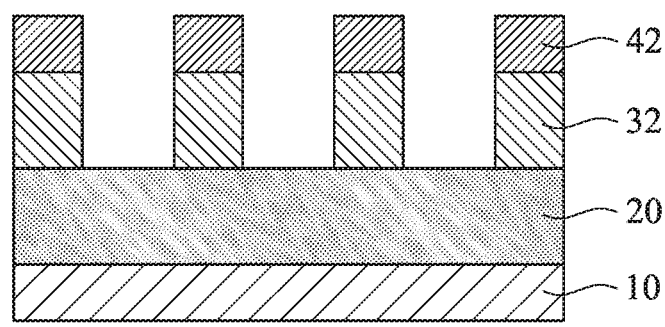
FIG. 5 shows one of the various stages of manufacturing operations of semiconductor devices according to an embodiment of the present disclosure.

Further, as shown in FIG. 5, the bottom layer 30 is patterned to form a patterned bottom layer 32 by using the patterned middle layer 42 as an etching mask. When the bottom layer 30 is made of organic material, one or more dry etching operations using $O_2$, $SO_2$, $CO_2$ and/or other suitable etching gas are employed to pattern the bottom layer 30. A CD variation between the patterned middle layer 42 and the patterned bottom layer 32 is within ±2 nm in some embodiments, and is within ±1.5 nm in other embodiments. A CD variation between the resist pattern 50 and the patterned bottom layer 32 is within ±3 nm in some embodiments, and is within ±2 nm in other embodiments.

Figure 6:
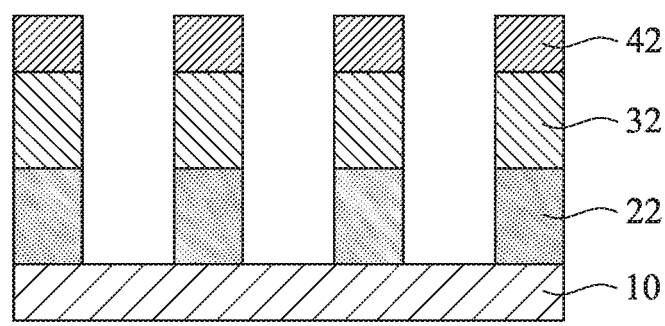
FIG. 6 shows one of the various stages of manufacturing operations of semiconductor devices according to an embodiment of the present disclosure.

Subsequently, as shown in FIG. 6, the underlying layer 20 is patterned to form a target pattern 22 by using the patterned middle layer 42 and the patterned bottom layer 32 as an etching mask. Depending on the material of the underlying layer 20, an appropriate etching gas is elected.

A CD variation between the resist pattern 50 and the target pattern 22 is within ±4 nm in some embodiments, and is within ±3 nm in other embodiments. After the target pattern 22 is formed, the patterned middle layer 42 and the patterned bottom layer 32 are removed.

In some embodiments, the patterned middle layer 42 is removed before patterning the underlying layer 20 and the underlying layer 20 is patterned by using the patterned bottom layer 32 as an etching mask.

As a middle layer of a tri-layer resist system, a silicon containing polymer, such as polysiloxane has been used. A silicon amount of polysiloxane is less than 50 wt %. In contrast, the middle layer of the present disclosure includes silicon in an amount of 50 wt % or more. Accordingly, a higher etching selectivity and a lower CD variation between the middle layer 40 and bottom layer 30 are obtained. In some embodiments, the middle layer 40 is free from silicon polymer such as polysiloxane. In other embodiments, the middle layer 40 contains silicon polymer, such as polysiloxane, and silicon particles or clusters as set forth above, such that the silicon amount in the middle layer 40 is 50 wt % or more.

FIGS. 8-12 show various stages of manufacturing a semiconductor device according to another embodiment of the present disclosure. It is understood that additional operations can be performed before, during, and after processes shown by FIGS. 8-12, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-7 may be employed in the following embodiments, and some of the explanations may be omitted.

Figure 8:
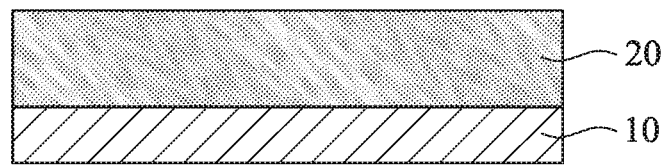
FIG. 8 shows one of the various stages of manufacturing operations of semiconductor devices according to another embodiment of the present disclosure.

FIGS. 8-12 show a bi-layer resist system, in which the bottom layer 30 is not used. As shown in FIG. 8, an underlying layer 20 to be patterned is formed over a substrate 10. One or more layers or structures are provided between the underlying layer 20 and the substrate 10 in some embodiments.

Figure 9:
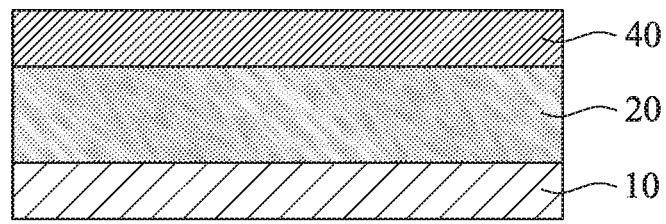
FIG. 9 shows one of the various stages of manufacturing operations of semiconductor devices according to another embodiment of the present disclosure.
Figure 10:
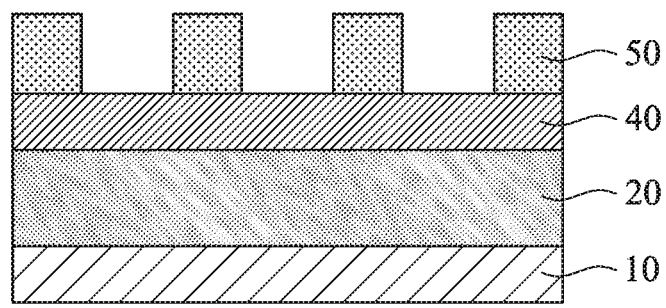
FIG. 10 shows one of the various stages of manufacturing operations of semiconductor devices according to another embodiment of the present disclosure.
Figure 11:
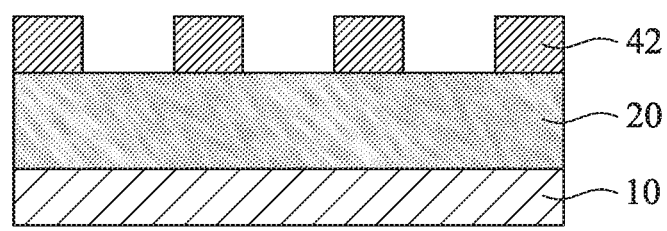
FIG. 11 shows one of the various stages of manufacturing operations of semiconductor devices according to another embodiment of the present disclosure.
Figure 12:
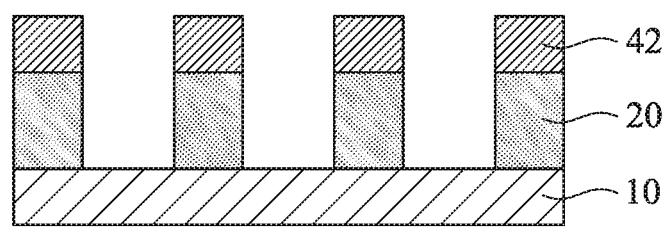
FIG. 12 shows one of the various stages of manufacturing operations of semiconductor devices according to another embodiment of the present disclosure.

Then, as shown in FIG. 9, a silicon containing layer 40 is formed on the underlying layer 20. Further, similar to FIG. 3, a photo resist pattern 50 is formed over the middle layer, as shown in FIG. 10. Subsequently, the silicon containing layer 40 is patterned as shown in FIG. 11. Then, the underlying layer 20 is patterned by one or more etching operations using the patterned silicon containing layer 42 as an etching mask, as shown in FIG. 12. In some embodiments, the patterned silicon containing layer 42 is removed thereafter.

Figure 13:
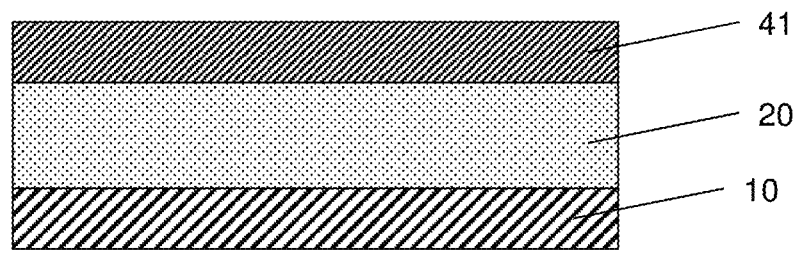
FIG. 13 shows one of the various stages of manufacturing operations of semiconductor devices according to another embodiment of the present disclosure.
Figure 14:
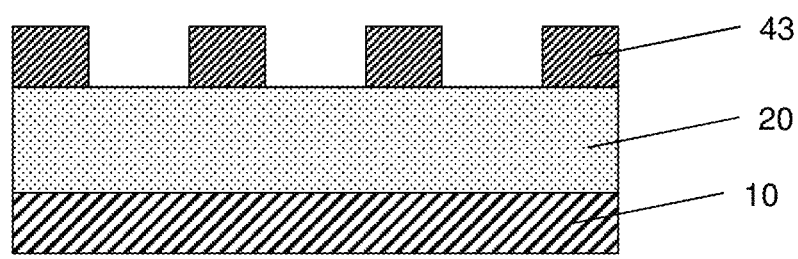
FIG. 14 shows one of the various stages of manufacturing operations of semiconductor devices according to another embodiment of the present disclosure.
Figure 15:
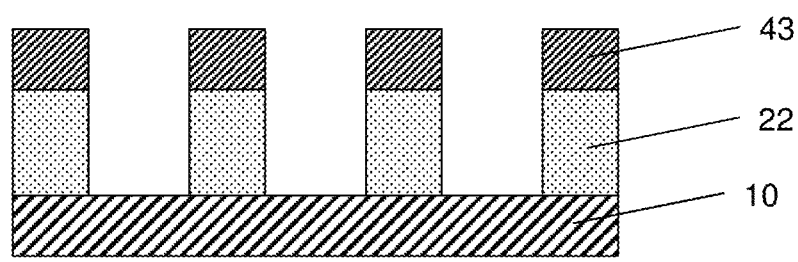
FIG. 15 shows one of the various stages of manufacturing operations of semiconductor devices according to another embodiment of the present disclosure.

FIGS. 13-15 show various stages of manufacturing a semiconductor device according to another embodiment of the present disclosure. It is understood that additional operations can be performed before, during, and after processes shown by FIGS. 13-15, and some of the operations described below can be replaced or eliminated for additional embodiments of the method. The order of the operations/processes may be interchangeable. Materials, configurations, dimensions, structures, conditions and operations the same as or similar to those explained with respect to FIGS. 1-12 may be employed in the following embodiments, and some of the explanations may be omitted.

In this embodiment, the silicon containing layer (middle layer 40 in the foregoing embodiments) is photo sensitive, and can be patterned by one or more lithography operation. In some embodiments, the silicon containing layer includes a photo active compound (PAC). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like. Other suitable materials are included in a photo sensitive silicon containing layer.

When the silicon containing layer is photo sensitive, no additional photo resist, such as photo resist pattern 50 in the foregoing embodiments, is necessary.

As shown in FIG. 13, a photo sensitive silicon containing layer 41 is formed over the underlying layer 20 including one or more layers of dielectric material or conductive material. The thickness of the photo sensitive silicon containing layer 41 is in a range from about 20 nm to about 100 nm in some embodiments, and is in a range from about 30 nm to about 80 nm in other embodiments. Then, a baking operation and/or an annealing operation as set forth above are performed. In some embodiments, the silicon containing layer 41 after the baking and/or annealing contains silicon in an amount of 50 wt % or more. In other embodiments, the silicon containing layer 41 contains silicon in an amount of 60 wt % or more. In certain embodiments, the Si amount of the silicon containing layer 41 is up to 70 wt % and in up to 80 wt % in other embodiments.

Then, as shown in FIG. 14, the photo sensitive silicon containing layer 41 is exposed to an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied. After development of the exposed photo resist, the pattern silicon containing layer 43 is obtained.

Subsequently, as shown in FIG. 15, the underlying layer 20 is patterned to form a target pattern 22 by using the patterned silicon containing layer 43 as an etching mask. Depending on the material of the underlying layer 20, an appropriate etching gas is elected.

A CD variation between the pattern silicon containing layer 43 and the target pattern 22 is within ±4 nm in some embodiments, and is within ±3 nm in other embodiments. After the target pattern 22 is formed, the pattern silicon containing layer 43 are removed in some embodiments.

FIGS. 16-20 show various stages of manufacturing a semiconductor device according to another embodiment of the present disclosure. It is understood that additional operations can be performed before, during, and after processes shown by FIGS. 16-20, and some of the operations described below can be replaced or eliminated for additional embodiments of the method. The order of the operations/processes may be interchangeable. Materials, configurations, dimensions, structures, conditions and operations the same as or similar to those explained with respect to FIGS. 1-15 may be employed in the following embodiments, and some of the explanations may be omitted.

Figure 16:
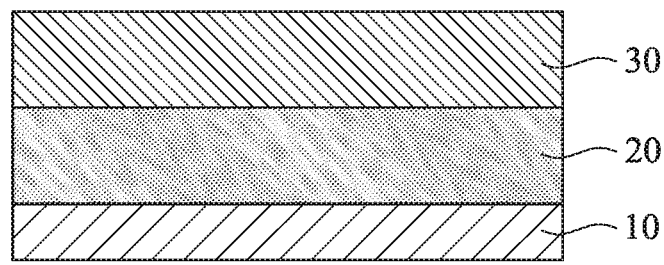
FIG. 16 shows one of the various stages of manufacturing operations of semiconductor devices according to another embodiment of the present disclosure.
Figure 17:
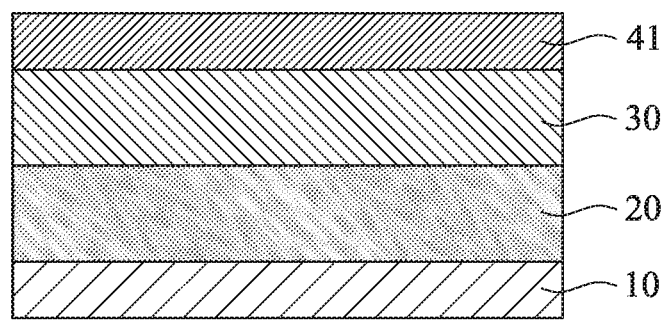
FIG. 17 shows one of the various stages of manufacturing operations of semiconductor devices according to another embodiment of the present disclosure.

Similar to FIG. 1, a bottom layer 30 is formed over the underlying layer 20, as shown in FIG. 16. Then, as shown in FIG. 17, a photo sensitive silicon containing layer 41 is formed over the bottom layer 30. The thickness of the photo sensitive silicon containing layer 41 is in a range from about 20 nm to about 100 nm in some embodiments, and is in a range from about 30 nm to about 80 nm in other embodiments.

Then, a baking operation and/or an annealing operation as set forth above are performed. In some embodiments, the silicon containing layer 41 after the baking and/or annealing contains silicon in an amount of 50 wt % or more. In other embodiments, the silicon containing layer 41 contains silicon in an amount of 60 wt % or more. In certain embodiments, the Si amount of the silicon containing layer 41 is up to 70 wt % and in up to 80 wt % in other embodiments.

Figure 18:
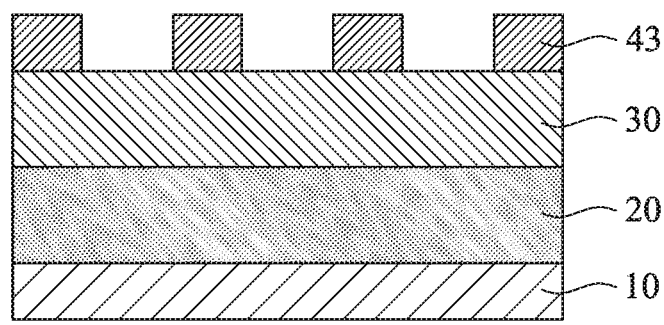
FIG. 18 shows one of the various stages of manufacturing operations of semiconductor devices according to another embodiment of the present disclosure.

Then, as shown in FIG. 18, the photo sensitive silicon containing layer 41 is exposed to an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied. After development of the exposed photo resist, the pattern silicon containing layer 43 is obtained.

Figure 19:
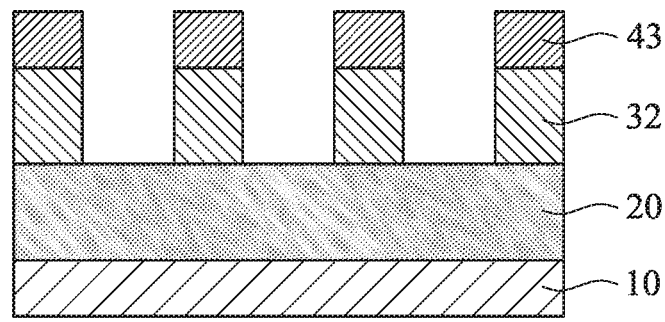
FIG. 19 shows one of the various stages of manufacturing operations of semiconductor devices according to another embodiment of the present disclosure.

Further, as shown in FIG. 19, the bottom layer 30 is patterned to form a patterned bottom layer 32 by using the patterned silicon containing layer 43 as an etching mask. When the bottom layer 30 is made of organic material, one or more dry etching operations using $O_2$, $SO_2$, $CO_2$ and/or other suitable etching gas are employed to pattern the bottom layer 30. A CD variation between the patterned silicon containing layer 43 and the patterned bottom layer 32 is within ±2 nm in some embodiments, and is within ±1.5 nm in other embodiments.

Figure 20:
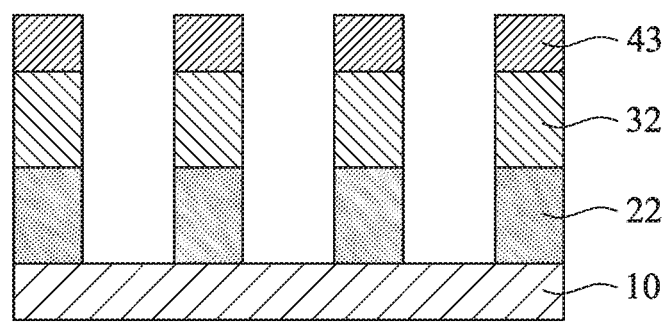
FIG. 20 shows one of the various stages of manufacturing operations of semiconductor devices according to another embodiment of the present disclosure.

Subsequently, as shown in FIG. 20, the underlying layer 20 is patterned to form a target pattern 22 by using the patterned silicon containing layer 43 and the patterned bottom layer 32 as an etching mask. Depending on the material of the underlying layer 20, an appropriate etching gas is elected.

A CD variation between the patterned silicon containing layer 43 and the target pattern 22 is within ±4 nm in some embodiments, and is within ±3 nm in other embodiments. After the target pattern 22 is formed, the patterned silicon containing layer 43 and the patterned bottom layer 32 are removed. In some embodiments, the patterned silicon containing layer 43 is removed before patterning the underlying layer 20 and the underlying layer 20 is patterned by using the patterned bottom layer 32 as an etching mask.

FIGS. 21-25 show various stages of manufacturing a semiconductor device according to another embodiment of the present disclosure. It is understood that additional operations can be performed before, during, and after processes shown by FIGS. 21-25, and some of the operations described below can be replaced or eliminated for additional embodiments of the method. The order of the operations/processes may be interchangeable. Materials, configurations, dimensions, structures, conditions and operations the same as or similar to those explained with respect to FIGS. 1-20 may be employed in the following embodiments, and some of the explanations may be omitted.

The semiconductor devices include interconnect structures that include a plurality of interconnect pattern (line) layers having conductive patterns and a plurality of contact holes/vias for connecting various features in one portion/feature of a semiconductor chip (die) to other portions/features of the chip. The interconnect and via structures are formed of conductive materials such as metal, and the semiconductor devices include several interconnect layers in various embodiments.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments.

Figure 21:
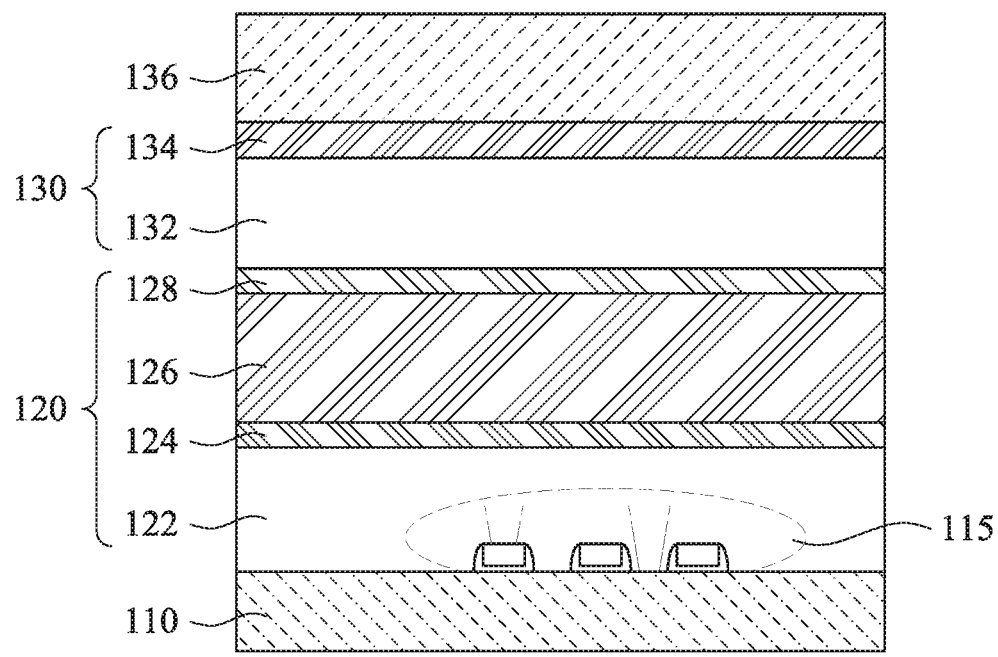
FIG. 21 shows one of the various stages of manufacturing operations of semiconductor devices according to another embodiment of the present disclosure.

As shown in FIG. 21, underlying structures 115 are disposed over an underlying layer and covered by a multi-layer structure 120. In some embodiments, the underlying layer is a substrate 110. In one embodiment, the substrate 110 is a silicon substrate. The underlying structures 115 include various devices, structures, layers and/or elements. Examples of the underlying devices may include static random access memories (SRAMs) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that this disclosure is not limited to a particular type of device.

These underlying devices 115 are covered by one or more of first interlayer dielectric (ILD) layers 122. The first interlayer dielectric layer 122 includes silicon oxide, silicon nitride, silicon oxynitride (SiON), SiOCN, fluorine-doped silicate glass (FSG), or a low-k dielectric material, or any other suitable dielectric material. The first interlayer dielectric layer may be formed by chemical vapor deposition (CVD) or other suitable film forming processes. The formed first interlayer dielectric layer may be subjected to a planarization process, such as an etch back process and/or a chemical mechanical polishing process.

After the first interlayer dielectric layer 122 is formed, an etch stop layer 124 is formed over the first interlayer dielectric layer 122. The etch stop layer 124 includes any known etch stop material, including, but not limited to, a silicon oxide, silicon nitride, silicon oxynitride, aluminum oxide, aluminum nitride, aluminum fluoride, titanium nitride, tantalum oxide, magnesium fluoride, and titanium silicon nitride. The thickness of the etch stop layer 124 is in a range from about 1 nm to about 10 nm in some embodiments. The etch stop layer 124 can be formed by CVD, atomic layer deposition (ALD) or any other suitable film forming methods.

Further, a second interlayer dielectric layer 126 is formed over the etch stop layer 124. The second interlayer dielectric 126 is made of a low-k dielectric material in some embodiments. The expression "low-k" material refers to materials with a dielectric constant less than that of $SiO_2$ (about 3.9). Suitable low-k dielectric materials include flowable oxides which are basically ceramic polymers, such as hydrogen silsesquioxane (HSQ). HSQ-type flowable oxides are used for gap filling between metal lines because of their flowability and ability to fill small openings. Additional low-k dielectrics include organic low-k materials, typically having a dielectric constant of about 2.0 to about 3.8. Organic low-k materials include a poly(arylene) ether, BCB (divinylsiloxane bis-benzocyclobutene), and organic-doped silica glasses (OSG) (also known as carbon-doped glasses). Other suitable types of low-k dielectrics are fluorine-doped silicate glasses (FSG) and SiCOH. FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. The thickness of the second interlayer dielectric layer 126 is in a range from about 10 nm to about 100 nm in some embodiments.

Further, a hard mask layer 128 is formed over the second inter layer dielectric layer 126. The hard mask layer 128 includes an insulating material, such as a silicon oxide, silicon nitride or a metal based material, such as a TiN or TaN. The thickness of the hard mask layer 128 is in a range from about 1 nm to about 10 nm in some embodiments.

In addition, in some embodiments, an antireflection coating layer (not shown) is formed over the hard mask layer 128 to improve photolithographic pattern fidelity during a subsequent process step. In certain embodiments, the antireflection coating layer is a nitrogen-free antireflection material comprising an organic material. In other embodiments, the antireflection coating layer includes TiN. The thickness of the antireflection coating layer is in a range from about 1 nm to about 10 nm in some embodiments. In some embodiments, a TiN layer is used as the hard mask layer and the antireflection layer.

After the hard mask layer 128 (and antireflection coating layer) is formed, a multilayer structure 130 is formed over the hard mask layer 128 (and antireflection coating layer), as shown in FIG. 21. The multilayer structure 130 includes a bottom layer 132 and a middle layer 134, similar to the bottom layer 30 and the middle layer 40. The bottom layer 132 is used to planarize the structure, as the underlying structure may be uneven depending on the structure of the devices 115 formed on the substrate 110.

The bottom layer 132 and the middle layer 134 are made of different materials such that the optical properties and/or etching properties of the bottom layer 132 and the middle layer 134 are different from each other.

After the middle layer 134 is formed, a photo resist layer 136 is formed over the middle layer 134, as shown in FIG. 21. The photo resist for the photo resist layer 136 is a chemically amplified photo resist and can be a positive tone photo resist or a negative tone photo resist. After the photo resist is spin coated on the middle layer 134, a baking operation at a substrate temperature in a range from about 80° C. to 120° C. is performed in some embodiments.

Next, the photo resist layer 136 is exposed with an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied.

Figure 22:
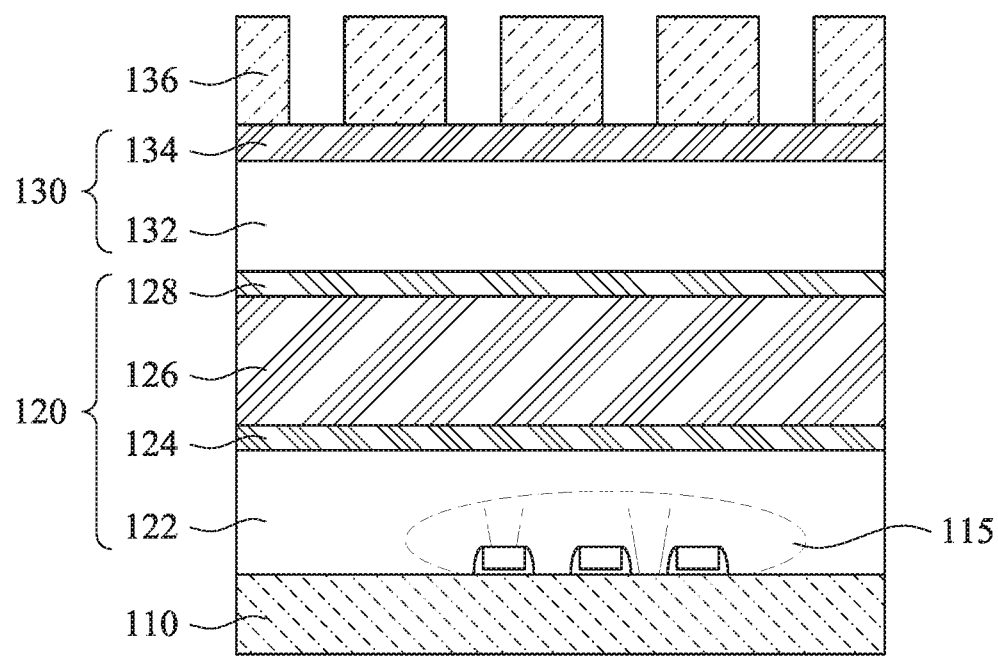
FIG. 22 shows one of the various stages of manufacturing operations of semiconductor devices according to another embodiment of the present disclosure.

FIG. 22 shows a cross section after the exposed resist is baked (post-exposure bake) and developed by a developing solution and a post-baking process is performed. When a positive tone chemically amplified resist is used, acid generated by the exposure light from a photo acid generator (PAG) in the photo resist cleaves acid-cleavable polymers in the photo resist during the post-exposure baking. After the acid cleaves the polymer, the polymer becomes more hydrophilic (i.e., soluble in an aqueous developer). After the polymer becomes more hydrophilic, the polymer cannot be dissolved by organic solvent, for example, normal butyl acetate, but can be dissolved by a basic solution, for example, 2.38% tetramethylammonium hydroxide (TMAH) solution.

When a negative tone chemically amplified resist is used, acid generated by the exposure light from a photo acid generator (PAG) in the photo resist catalyzes a cross-linking reaction of acid catalyzed cross linkable polymer in the photo resist or causes polymeric pinacol in the photo resist to undergo pinacol rearrangement, during the post-exposure baking. After the polymer cross linking or the undergoing of pinacol rearrangement, the polymers become more hydrophobic. After the polymer become more hydrophobic, the polymers are not dissolved by a basic developing solution, for example, 2.38% TMAH solution.

Since the middle layer 134 is not photo-sensitive (not a photo resist), the developed patterns of the photo resist layer 136 are formed on the middle layer and upper surfaces of the middle layer 134 are exposed where no resist patterns exist.

Figure 23:
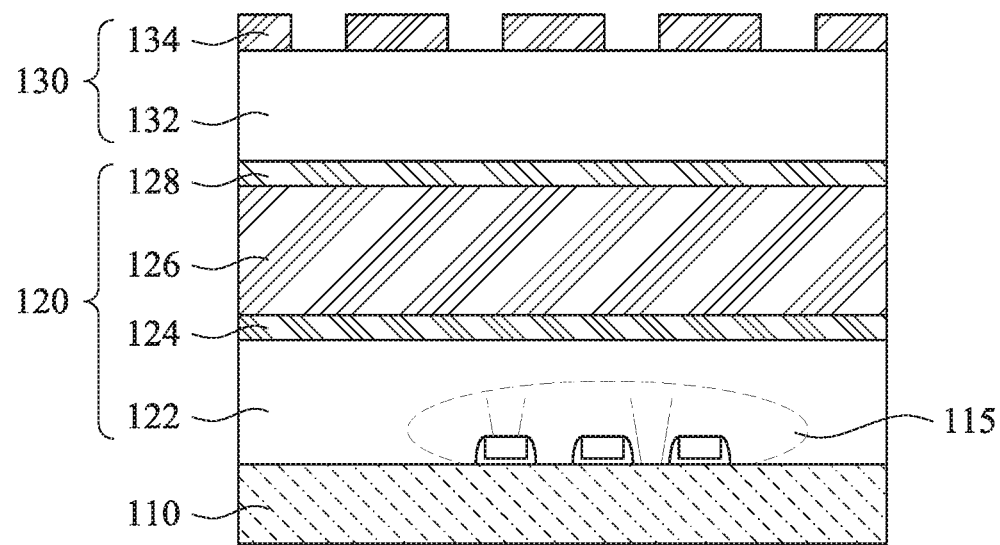
FIG. 23 shows one of the various stages of manufacturing operations of semiconductor devices according to another embodiment of the present disclosure.

After the photo resist layer is patterned, the middle layer 134 are patterned by using one or more etching operations, using the patterned photo resist layer 136 as an etching mask, as shown in FIG. 23. After the patterning operation(s), the photo resist layer 136 is removed.

Figure 24:
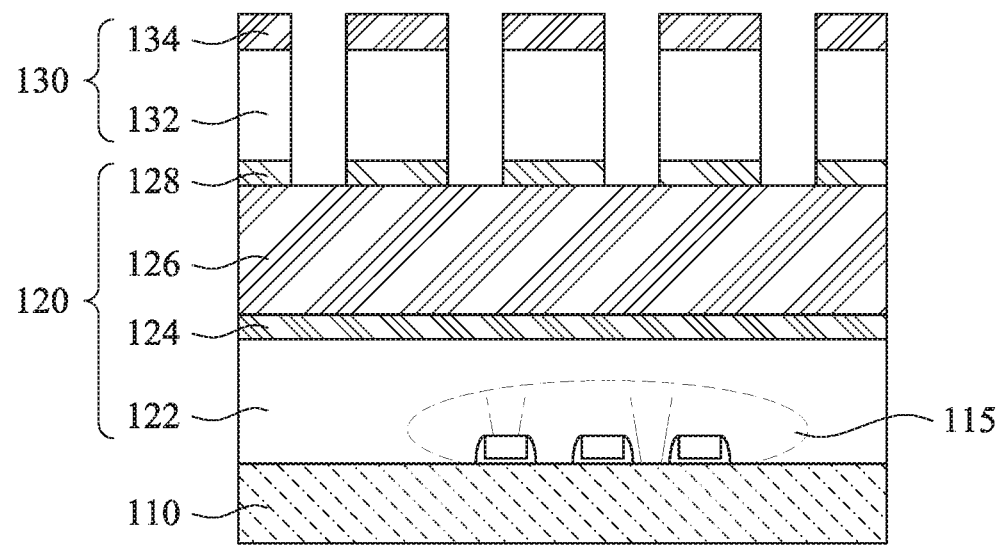
FIG. 24 shows one of the various stages of manufacturing operations of semiconductor devices according to another embodiment of the present disclosure.

Further, in some embodiments, as shown in FIG. 24, the bottom layer 132 and the hard mask layer 128 are patterned using appropriate etchants and etching operations for each layer. After the patterning operation(s), the middle layer 134 and the bottom layer 132 are removed.

Figure 25:
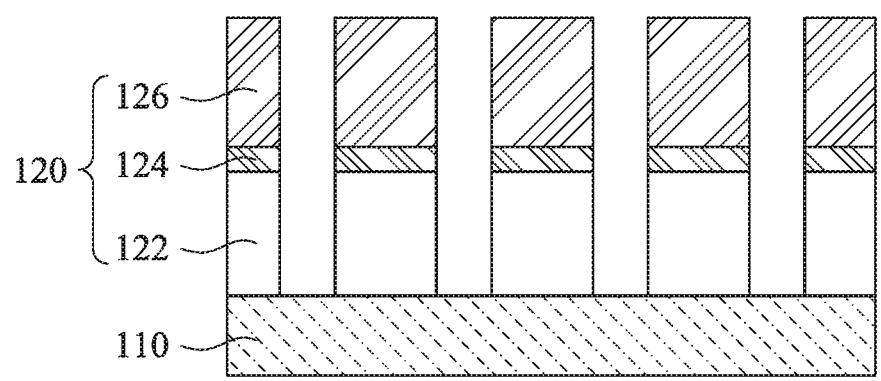
FIG. 25 shows one of the various stages of manufacturing operations of semiconductor devices according to another embodiment of the present disclosure.

Subsequently, by using the patterned hard mask 128 as an etching mask, the second interlayer dielectric layer 126, the etch stop layer 124 and the first interlayer dielectric layer 122 are patterned by appropriate etching operations, as shown in FIG. 25. After the patterning operation(s), the hard mask layer 128 is removed.

Then, the patterns (e.g., through-hole patterns) are filled with conductive material, such as Al, Cu, W, Co, or Ni. The conductive material is deposited by CVD, ALD, PVD, electroplating or any other suitable film formation method, and the deposited conductive material is subsequently planarized by a CMP operation or etch-back operation. It is understood that the structure shown in FIG. 25 undergoes further CMOS processes to form various features such as interconnect vias, interconnect metal layers, passivation layers, etc.

The various embodiments or examples described herein offer several advantages over the existing art. In the present disclosure, by using a silicon containing middle layer as set forth above, it is possible to improve pattern size control in the lithographic and etching operations.

According to one aspect of the disclosure, in a pattern formation method, a bottom layer is formed over an underlying layer. A middle layer is formed over the bottom layer. A resist pattern is formed over the middle layer. The middle layer is patterned by using the resist pattern as an etching mask. The bottom layer is patterned by using the patterned middle layer. The underlying layer is patterned. The middle layer contains silicon in an amount of 50 wt % or more and an organic material. In one or more of the foregoing and following embodiments, an annealing operation is further performed after the middle layer is formed. In one or more of the foregoing and following embodiments, a temperature of the annealing operation is in a range from 200° C. to 500° C. In one or more of the foregoing and following embodiments, the annealing operation is thermal baking on a baking plate. In one or more of the foregoing and following embodiments, a process time of the thermal baking is in a range from 30 sec to 300 sec. In one or more of the foregoing and following embodiments, the annealing operation is lamp annealing. In one or more of the foregoing and following embodiments, the annealing operation is laser annealing. In one or more of the foregoing and following embodiments, a thickness of the middle layer after the annealing operation is in a range from 15 nm to 90 nm. In one or more of the foregoing and following embodiments, the bottom layer is made of an organic material. In one or more of the foregoing and following embodiments, a thickness of the bottom layer is in a range from 50 nm to 200 nm. In one or more of the foregoing and following embodiments, the middle layer contains silicon in an amount of 80 wt % or less. In one or more of the foregoing and following embodiments, the middle layer is formed by spin-coating a silicon containing solution. In one or more of the foregoing and following embodiments, the silicon containing solution includes a silicon particle and a solvent. In one or more of the foregoing and following embodiments, a size of the silicon particle is in a range from 1 nm to 20 nm. In one or more of the foregoing and following embodiments, the silicon particle includes a silicon core surrounded by a plurality of ligands. In one or more of the foregoing and following embodiments, a diameter of the silicon core is in a range from 2 nm to 10 nm. In one or more of the foregoing and following embodiments, each of the plurality of ligands is an organic ligand.

In one or more of the foregoing and following embodiments, the organic ligand has a chemical structure R-Lp, which includes at least a first spacer group R and a polar group Lp, the first spacer group R include one or more of hydrogen, aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12, and the polar group Lp includes one or more of —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

In accordance with another aspect of the present disclosure, in a pattern formation method, a Si-containing layer is formed over an underlying layer. A resist pattern is formed over the Si-containing layer. The Si-containing layer is patterned by using the resist pattern as an etching mask. The underlying layer is patterned by using the patterned Si-containing layer. The Si-containing layer contains silicon in an amount of 50 wt % or more or 70 wt % or less, and is none of an amorphous silicon layer, a polysilicon layer, a silicon oxide based layer or a silicon nitride based layer.

In accordance with another aspect of the present disclosure, a silicon containing solution for manufacturing a semiconductor device is provided. The silicon containing solution includes silicon particles or silicon clusters and a solvent. The silicon particles or the silicon clusters include silicon in an amount of 50 wt % or more or 80 wt % or less, and each of the silicon particles or the silicon clusters includes a silicon core surrounded by a plurality of organic ligands.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method comprising:
   forming a bottom layer over an underlying layer;
   forming a middle layer over the bottom layer;
   forming a resist pattern over the middle layer;
   patterning the middle layer by using the resist pattern as an etching mask;
   patterning the bottom layer by using the patterned middle layer; and
   patterning the underlying layer, wherein:
   the middle layer contains silicon in an amount of 50 wt % or more with respect to an entire weight of the middle layer and an organic material,
   the middle layer is formed by spin-coating a silicon containing solution,
   the silicon containing solution includes a silicon particle and a solvent,
   the silicon particle includes a silicon core surrounded by a plurality of ligands, each of the plurality of organic ligands has a chemical structure R-Lp, which includes at least a first spacer group R and a polar group Lp linked to the silicon core.

2. The pattern formation method of claim 1, further comprising performing an annealing operation after the middle layer is formed.

3. The pattern formation method of claim 2, wherein a temperature of the annealing operation is in a range from 200° C. to 500° C.

4. The pattern formation method of claim 2, wherein the annealing operation is thermal baking on a baking plate.

5. The pattern formation method of claim 4, wherein a process time of the thermal baking is in a range from 30 sec to 300 sec.

6. The pattern formation method of claim 2, wherein the annealing operation is lamp annealing.

7. The pattern formation method of claim 2, wherein the annealing operation is laser annealing.

8. The pattern formation method of claim 2, wherein a thickness of the middle layer after the annealing operation is in a range from 15 nm to 90 nm.

9. The pattern formation method of claim 1, wherein the bottom layer is made of an organic material.

10. The pattern formation method of claim 9, wherein a thickness of the bottom layer is in a range from 50 nm to 200 nm.

11. The pattern formation method of claim 1, wherein the middle layer contains silicon in an amount of 80 wt % or less.

12. The pattern formation method of claim 1, wherein a size of the silicon particle is in a range from 1 nm to 20 nm.

13. The pattern formation method of claim 1, wherein a diameter of the silicon core is in a range from 2 nm to 10 nm.

14. The pattern formation method of claim 1, wherein:
the first spacer group R include one or more of hydrogen, aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12, and
the polar group Lp includes one or more of —Cl, —Br, —I, —NO$_2$, —SO$_3$—, —H, —CN, —NCO, —OCN, —CO$_2$—, —OH, —OR*, —OC(O)CR*, —SR*, —SO$_2$N(R*)$_2$, —SO$_2$R*, —SOR*, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

15. A pattern formation method comprising:
forming a Si-containing layer over an underlying layer;
forming a resist pattern over the Si-containing layer;
patterning the Si-containing layer by using the resist pattern as an etching mask; and
patterning the underlying layer by using the patterned Si-containing layer,
wherein the Si-containing layer contains silicon particles in an amount of 50 wt % or more with respect to an entire weight of the Si-containing layer, and is none of an amorphous silicon layer, a polysilicon layer, a silicon oxide based layer or a silicon nitride based layer, and
each of the silicon particles includes a silicon core surrounded by a plurality of ligands, each of the plurality of organic ligands has a chemical structure R-Lp, which includes at least a first spacer group R and a polar group Lp linked to the silicon core.

16. The pattern formation method of claim 15, wherein
the first spacer group R include one or more of hydrogen, aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12, and
the polar group Lp includes one or more of —Cl, —Br, —I, —NO$_2$, —SO$_3$—, —H, —CN, —NCO, —OCN, —CO$_2$—, —OH, —OR*, —OC(O)CR*, —SR*, —SO$_2$N(R*)$_2$, —SO$_2$R*, —SOR*, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

17. The pattern formation method of claim 15, wherein the Si-containing layer contains silicon particles in an amount of 50 wt % or more and 70 wt % or less with respect to an entire weight of the Si-containing layer.

18. A pattern formation method comprising:
forming a Si-containing layer over an underlying layer;
forming a resist pattern over the Si-containing layer;
patterning the Si-containing layer by using the resist pattern as an etching mask; and
patterning the underlying layer by using the patterned Si-containing layer, wherein:
the Si-containing layer is formed by applying a silicon containing solution over the underlying layer,
the silicon containing solution comprises:
silicon particles or silicon clusters; and
a solvent,
the silicon particles or the silicon clusters include silicon in an amount of 50 wt % or more and 80 wt % or less with respect to an entire weight of the Si-containing layer, and
each of the silicon particles or the silicon clusters includes a silicon core surrounded by a plurality of organic ligands.

19. The pattern formation method of claim 18, wherein each of the plurality of organic ligands has a chemical structure R-Lp, which includes at least a first spacer group R and a polar group Lp linked to the silicon core.

20. The pattern formation method of claim 19, wherein
the first spacer group R include one or more of hydrogen, aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12, and
the polar group Lp includes one or more of —Cl, —Br, —I, —NO$_2$, —SO$_3$—, —H, —CN, —NCO, —OCN, —CO$_2$—, —OH, —OR*, —OC(O)CR*, —SR*, —SO$_2$N(R*)$_2$, —SO$_2$R*, —SOR*, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

* * * * *